US012588537B2

(12) United States Patent
Kouda et al.

(10) Patent No.: US 12,588,537 B2
(45) Date of Patent: Mar. 24, 2026

(54) SEMICONDUCTOR DEVICE COMPRISING LEAD FRAME AND BONDING WIRE AND MANUFACTURING METHOD FOR THE SEMICONDUCTOR DEVICE

(71) Applicant: HAMAMATSU PHOTONICS K.K., Hamamatsu (JP)

(72) Inventors: Ryousuke Kouda, Hamamatsu (JP); Kousuke Hirata, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 580 days.

(21) Appl. No.: 17/921,178

(22) PCT Filed: Jan. 19, 2021

(86) PCT No.: PCT/JP2021/001712
§ 371 (c)(1),
(2) Date: Oct. 25, 2022

(87) PCT Pub. No.: WO2021/220559
PCT Pub. Date: Nov. 4, 2021

(65) Prior Publication Data
US 2023/0170324 A1      Jun. 1, 2023

(30) Foreign Application Priority Data

Apr. 30, 2020     (JP) ................................. 2020-080358

(51) Int. Cl.
*H01L 23/00*        (2006.01)
(52) U.S. Cl.
CPC .............. *H01L 24/48* (2013.01); *H01L 24/45* (2013.01); *H01L 24/85* (2013.01);
(Continued)

(58) Field of Classification Search
CPC ......... H01L 24/49; H01L 24/48; H01L 24/45; H01L 24/85; H01L 2224/48091;
(Continued)

(56) References Cited

U.S. PATENT DOCUMENTS 6,343,733  B1      2/2002  Nishiura et al.
2006/0216863  A1*   9/2006  Arakawa ................. H01L 24/48
                                                              438/118
(Continued)

FOREIGN PATENT DOCUMENTS

CN            101335252  A     12/2008
CN            102024724  A     4/2011
(Continued)

OTHER PUBLICATIONS

International Preliminary Report on Patentability mailed Nov. 10, 2022 for PCT/JP2021/001712.

*Primary Examiner* — Didarul A Mazumder
(74) *Attorney, Agent, or Firm* — Faegre Drinker Biddle & Reath LLP

(57) ABSTRACT

A semiconductor device includes a mounting substrate having a first surface, a semiconductor chip mounted on the first surface and having a second surface facing a side opposite to the first surface, and a wire extending from a first joint point on the first surface toward a second joint point on the second surface and electrically connecting the mounting substrate and the semiconductor chip to each other by connecting the first joint point and the second joint point to each other. The wire includes a first part, a first bent portion, a second part, a second bent portion, and a third part arranged in order from the first joint point toward the second
(Continued)

joint point. The first part is positioned on the first surface side with respect to the second surface when viewed in a first direction along the first surface and the second surface.

6 Claims, 8 Drawing Sheets

(52) U.S. Cl.
CPC ............... *H01L 2224/45144* (2013.01); *H01L 2224/48091* (2013.01); *H01L 2224/48097* (2013.01); *H01L 2224/48227* (2013.01); *H01L 2224/48464* (2013.01); *H01L 2224/85035* (2013.01)

(58) Field of Classification Search
CPC ... H01L 2224/4809; H01L 2224/48097; H01L 2224/48227; H01L 2224/48464; H01L 2224/78301; H01L 2224/85169; H01L 24/78; H01L 2224/85205; H01L 2224/85035; H01L 2224/85051; H01L 21/52; H01L 23/12

USPC .......................................... 257/666; 438/123
See application file for complete search history.

(56) References Cited

U.S. PATENT DOCUMENTS

| | | | | |
|---|---|---|---|---|
| 2008/0136027 A1* | 6/2008 | Moon | ...................... | H01L 24/48 |
| | | | | 257/738 |
| 2011/0260337 A1* | 10/2011 | Handa | ................... | H01L 21/561 |
| | | | | 257/E23.141 |
| 2014/0306328 A1* | 10/2014 | Mikado | ............. | H01L 23/49562 |
| | | | | 257/666 |
| 2015/0262969 A1 | 9/2015 | Kasuya et al. | | |
| 2020/0194405 A1* | 6/2020 | Koyanagi | ............. | H01L 25/072 |

FOREIGN PATENT DOCUMENTS

| | | | |
|---|---|---|---|
| JP | H11-121500 A | | 4/1999 |
| JP | 3189115 B2 | | 7/2001 |
| JP | 2007-134585 A | | 5/2007 |
| JP | 2011-210936 A | | 10/2011 |
| JP | 2014-225643 A | | 12/2014 |
| JP | 2018195658 A | * | 12/2018 |

\* cited by examiner (a)

(b)

(a)

(b)

(a)

(b)

(c)

(a)

(b)

(c)

(a)

(b)

(c)

(a)

(b)

(a)

(b)

(a)

(b)

SEMICONDUCTOR DEVICE COMPRISING LEAD FRAME AND BONDING WIRE AND MANUFACTURING METHOD FOR THE SEMICONDUCTOR DEVICE

TECHNICAL FIELD

The present disclosure relates to a semiconductor device and a manufacturing method for a semiconductor device.

BACKGROUND ART

Patent Literature 1 describes a semiconductor device. In this semiconductor device, a pad (first bonding point) of a semiconductor chip mounted in a lead frame and a lead (second bonding point) of the lead frame are connected to each other using a wire. A shape of a wire loop connected to the first bonding point and the second bonding point is a trapezoidal shape in a side view due to a neck height portion on the first bonding point side, an inclined portion on the second bonding point side, and a trapezoidal length part (loop top part) between the neck height portion and the inclined portion. The trapezoidal length part is formed with a tendency of having a shape recessed downward.

CITATION LIST

Patent Literature

[Patent Literature 1] Japanese Patent No. 3189115

SUMMARY OF INVENTION

Technical Problem

The foregoing semiconductor device described in Patent Literature 1 aims to form a loop having a strong shape retaining force against pressurization from outside by forming a loop top part of a wire with a tendency of having a recessed shape.

On the other hand, such semiconductor devices described above are required to be sealed with a resin. In this case, a sealing resin is also disposed between the wire and a lead frame (the wire holds a sealing resin). Therefore, stress caused by expansion and contraction of the sealing resin due to a thermal cycle is applied to the wire. As an amount of resin between the wire and the lead frame increases, stress applied to the wire according to the thermal cycle increases, and thus there is concern that the wire may be damaged and reliability may be degraded.

An object of the present disclosure is to provide a semiconductor device and a manufacturing method for a semiconductor device capable of curbing degradation in reliability.

Solution to Problem

A semiconductor device according to the present disclosure includes a mounting substrate having a first surface, a semiconductor chip mounted on the first surface and having a second surface facing a side opposite to the first surface, and a wire extending from a first joint point on the first surface toward a second joint point on the second surface and electrically connecting the mounting substrate and the semiconductor chip to each other by connecting the first joint point and the second joint point to each other. The wire includes a first part, a first bent portion, a second part, a second bent portion, and a third part arranged in order from the first joint point toward the second joint point. The first part is positioned on the first surface side with respect to the second surface when viewed in a first direction along the first surface and the second surface. The first bent portion is positioned on the first surface side with respect to the second surface when viewed in the first direction and is bent such that the second part is guided to the second surface side. The second part extends over the second surface on a side opposite to the first surface when viewed in the first direction. The second bent portion is bent such that the third part is guided to the second surface side. The third part extends from a position over the second surface on a side opposite to the first surface toward the second surface when viewed in the first direction and is joined to the second joint point.

In this semiconductor device, a wire for electrically connecting the mounting substrate and the semiconductor chip mounted on the mounting substrate to each other is provided. The wire connects the first joint point on the first surface of the mounting substrate on which the semiconductor chip is mounted and the second joint point on the second surface of the semiconductor chip to each other. The wire includes the first part, the first bent portion, the second part, the second bent portion, and the third part arranged in order from the first joint point toward the second joint point (from the mounting substrate toward the semiconductor chip). The first part is a part of the wire extending from the first joint point and is positioned on the first surface side with respect to the second surface (for example, below the second surface). In addition, the third part is a part of the wire joined to the second joint point and is positioned at a position over the second surface on a side opposite to the first surface (for example, above the second surface). The second part is a part between the first part and the third part and extends over the second surface from a position on the first surface side.

According to such a structure, when the semiconductor device is resin-sealed, a sealing resin is disposed between the wire and the mounting substrate. On the contrary, regarding this wire, the first bent portion between the first part and the second part is positioned on the first surface side with respect to the second surface and is bent such that the second part is guided to the second surface side. Namely, compared to a case of having no first bent portion, the wire (that is, the first part) extends to the first surface side until it reaches the first bent portion. In the meantime, after it reaches the first bent portion, the wire (that is, the second part) extends over the second surface. Namely, compared to a case of having no first bent portion, the wire extends along edge portions formed by the mounting substrate and the semiconductor chip. As a result, an amount of resin held by the wire when the semiconductor device is resin-sealed is reduced. Thus, according to this semiconductor device, stress applied to the wire according to a thermal cycle can be reduced, and degradation in reliability can be curbed.

In this semiconductor device, the wire is bent at a position over the second surface in the second bent portion between the second part and the third part, and the third part is guided to the second surface side. Further, the third part extends from a position over the second surface toward the second surface and is joined to the second joint point. For this reason, compared to a case in which the second bent portion and the third part are not provided and the second part extends from the first surface side and is directly joined to the second joint point, a situation in which the wire comes into contact with an edge portion of the semiconductor chip is avoided. Thus, degradation in reliability can be further curbed.

In the semiconductor device according to the present disclosure, the first bent portion may be positioned on the first joint point side with respect to a center of the wire in an extending direction. In this case, the first bent portion is formed at a position comparatively away from the semiconductor chip. As a result, when the first bent portion is formed, a situation in which a holding tool (capillary) for holding the wire comes into contact with the semiconductor chip is curbed.

In the semiconductor device according to the present disclosure, the first bent portion may be positioned on the second joint point side with respect to a center of the wire in an extending direction. In this case, the first bent portion is formed at a position comparatively closer to the semiconductor chip. As a result, a relatively long part of the wire extending to the first surface side (first part) is secured so that the amount of resin held by the wire is further reduced. That is, stress applied to the wire can be reliably reduced, and degradation in reliability can be reliably curbed.

In the semiconductor device according to the present disclosure, the wire may include a fourth part extending such that the first bent portion and the second part are connected to each other. In this case, since an amount of height of the semiconductor chip from the first surface can be secured by at least two parts such as the second part and the fourth part, sharp bending in which concentration of stress is likely to occur is no longer necessary. Thus, degradation in reliability can be more reliably curbed.

In the semiconductor device according to the present disclosure, the wire may extend obliquely with respect to an outer edge of the semiconductor chip when viewed in a second direction intersecting the second surface. In this case, compared to a case in which the wire is perpendicular to the outer edge of the semiconductor chip, it is easy to secure a long length of the wire (a distance between the first joint point and the second joint point). As a result, it is easy to realize the foregoing structure of a wire including a plurality of parts and a plurality of bent portions.

A manufacturing method for a semiconductor device according to the present disclosure is a manufacturing method for a semiconductor device for manufacturing the foregoing semiconductor device including a first step of preparing the mounting substrate, the semiconductor chip mounted on the first surface of the mounting substrate, and at least a base material for the wire; a second step of moving a capillary holding the base material to the first joint point and joining a tip of the base material caused to protrude from the capillary to the first joint point, after the first step; a third step of moving the capillary while the base material is drawn from the capillary and forming at least the first part, the first bent portion, the second part, the second bent portion, and the third part arranged in order, after the second step; and a fourth step of moving the capillary to the second joint point and constituting the wire extending from the first joint point to the second joint point by joining the base material to the second joint point, after the third step.

According to this manufacturing method, the semiconductor device described above is manufactured. That is, a semiconductor device capable of curbing degradation in reliability is obtained.

The manufacturing method for a semiconductor device according to the present disclosure may further include a fifth step of moving the capillary to the second joint point and forming a bonding portion at the second joint point by joining a tip of the base material caused to protrude from the capillary to the second joint point and cutting the tip thereafter, after the first step and before the second step. In the fourth step, the base material may be joined to the second joint point with the bonding portion therebetween. In this case, when the tip of the base material protruding from the capillary is joined to the second joint point after each of the portions of the wire is formed, a bonding portion which has already been formed at the second joint point is interposed therebetween, and thus an impact to the semiconductor chip side is reduced. Particularly, here, since the bonding portion is formed using the capillary and the base material for forming each of the portions of the wire, simplification of the steps is achieved.

Advantageous Effects of Invention

According to the present disclosure, it is possible to provide a semiconductor device and a manufacturing method for a semiconductor device capable of curbing degradation in reliability.

DESCRIPTION OF EMBODIMENTS

Hereinafter, embodiments will be described in detail with reference to the drawings. In each of the drawings, the same reference signs are applied to elements which are the same or corresponding, and duplicate description thereof may be omitted.

Figure 1:
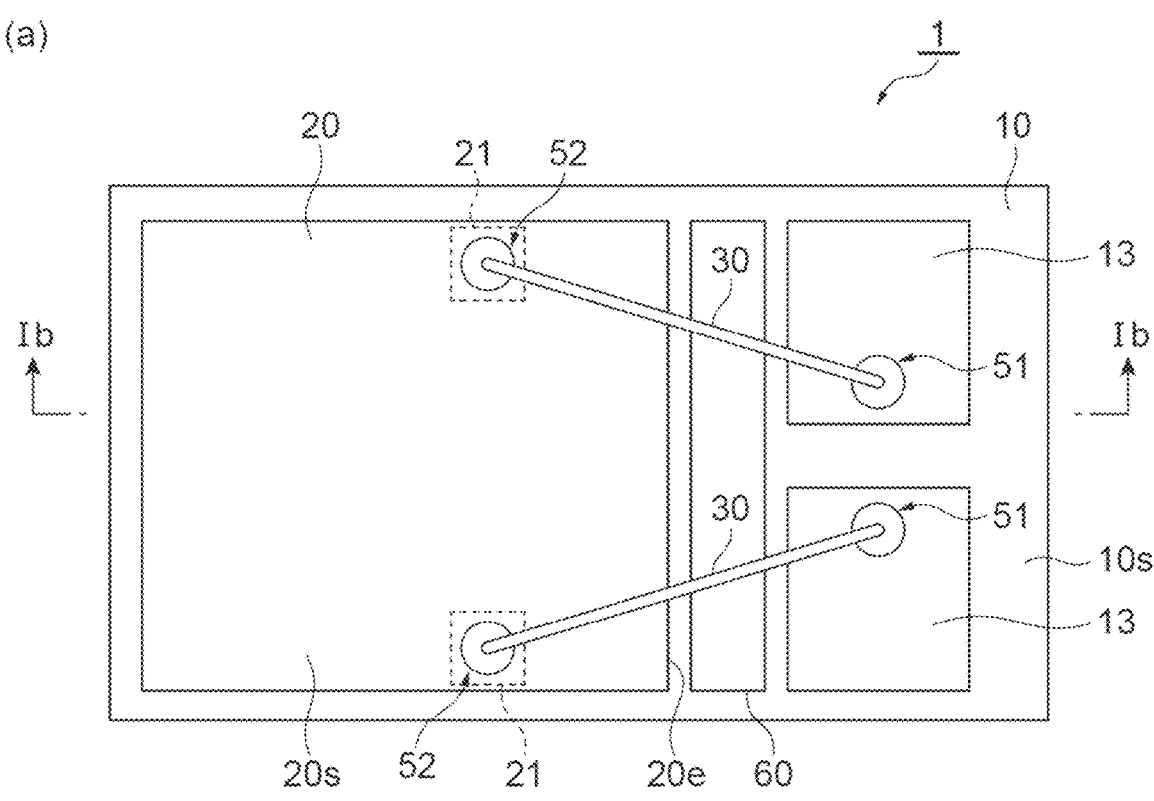
FIG. 1 is a view illustrating a semiconductor device according to an embodiment.
Figure 1:
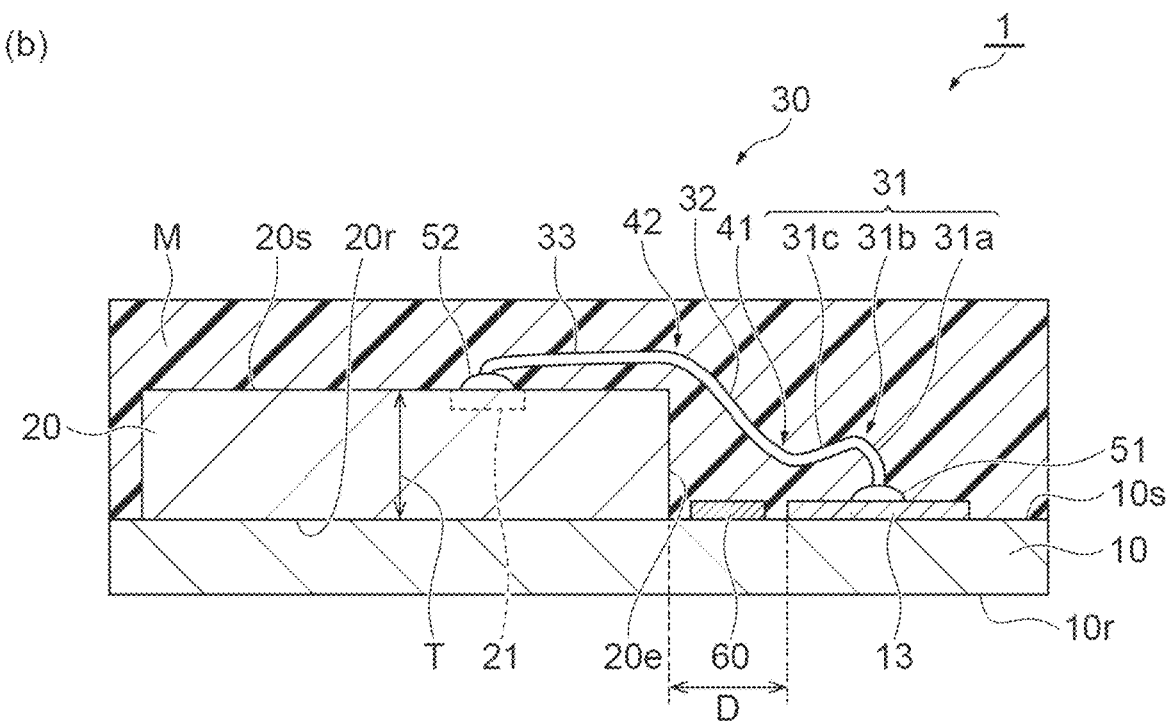
Figure 2:
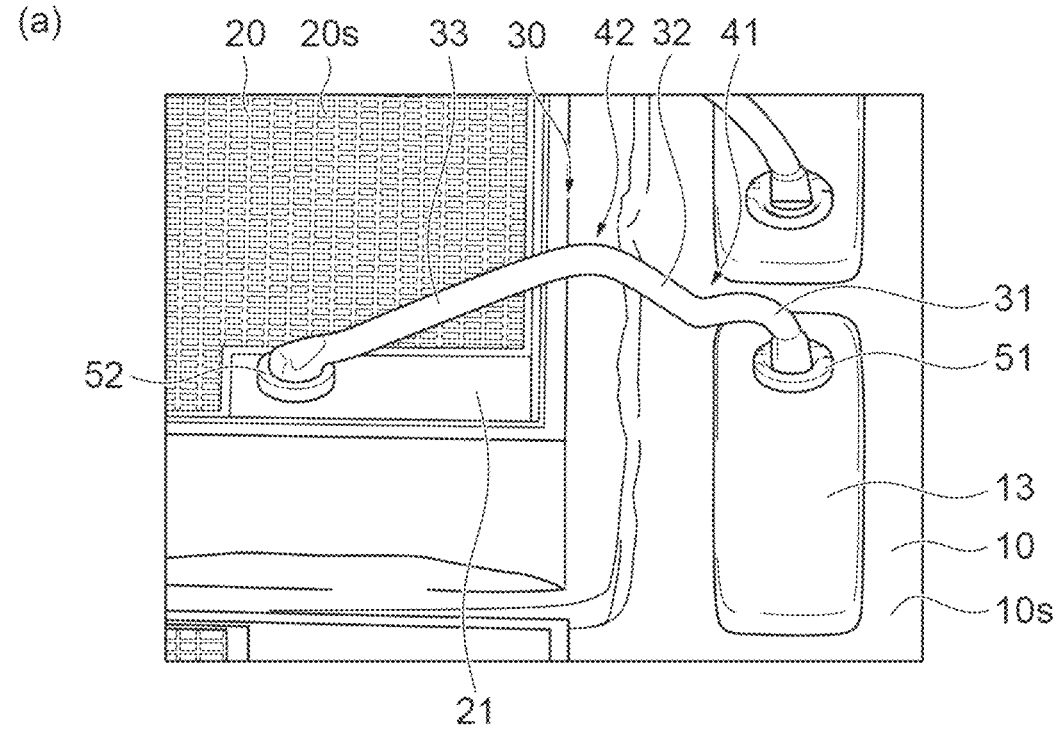
FIG. 2 is photographs showing an example of the semiconductor device illustrated in FIG. 1.
Figure 2:
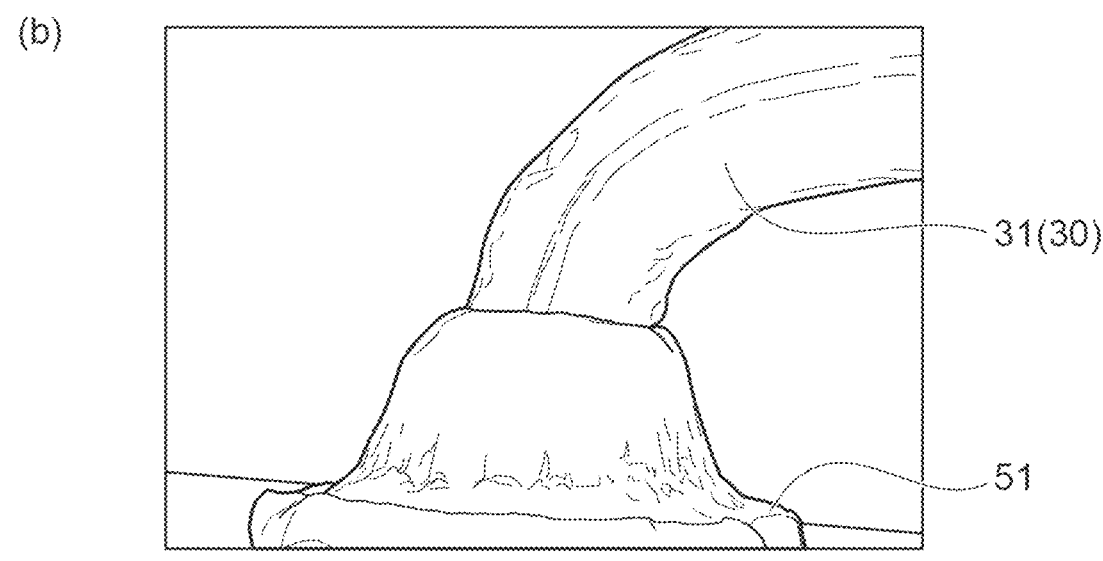

FIG. 1 is a view illustrating a semiconductor device according to an embodiment. FIG. 1(a) is a schematic plan view, and FIG. 1(b) is a schematic cross-sectional view along line Ib-Ib in FIG. 1(a). FIG. 2 is photographs showing an example of the semiconductor device illustrated in FIG. 1. As illustrated in FIGS. 1 and 2, a semiconductor device 1 includes a mounting substrate 10, a semiconductor chip 20, wires 30, and a resin portion M. In FIG. 1(a), illustration of the resin portion M is omitted.

The mounting substrate 10 includes a front surface (first surface) 10s and a rear surface 10r on a side opposite to the front surface 10s. A plurality of electrodes 13 having a flat plate shape are formed on the front surface 10s. As an example, each of the plurality of electrodes 13 has a shape elongated in a direction along an outer edge 20e of the semiconductor chip 20, which will be described below. The plurality of electrodes 13 are arranged along the outer edge 20e.

The semiconductor chip 20 is mounted on the front surface 10s. The semiconductor chip 20 may be directly disposed on the front surface 10s or may be disposed on the front surface 10s with another member therebetween. The semiconductor chip 20 includes a front surface (second surface) 20s and a rear surface 20r on a side opposite to the front surface 20s. The front surface 20s and the rear surface 20r regulate a height T of the semiconductor chip 20 from the front surface 10s as a distance therebetween. The rear surface 20r is a surface facing the front surface 10s side of the mounting substrate 10, and the front surface 20s is a surface facing a side opposite to the front surface 10s of the mounting substrate 10. Here, at least the front surface 10s and the front surface 20s are parallel to each other.

As an example, the semiconductor chip 20 exhibits a rectangular parallelepiped shape and has the outer edge 20e which linearly extends. The outer edge 20e is an outer edge facing the electrode 13 side (a bonding portion 51 side which will be described below) in the outer edges of the semiconductor chip 20. For example, the semiconductor chip 20 is a semiconductor light receiving element (as an example, a Si photodiode).

The bonding portions 51 are formed on the front surface 10s of the mounting substrate 10, and bonding portions 52 are formed on the front surface 20s of the semiconductor chip 20. The bonding portions 51 are formed on the electrodes 13. The bonding portions 52 are formed on electrodes 21 exposed on the front surface 20s side of the semiconductor chip 20 and are electrically connected to the semiconductor chip 20. As described below, here, the bonding portions 51 and 52 are integrally formed with the wires 30 using the same material as the wires 30. Therefore, the wires 30 are joined to the electrodes 13 with the bonding portions 51 therebetween on the mounting substrate 10 side and are joined to the electrodes 21 with the bonding portions 52 therebetween on the semiconductor chip 20 side. Namely, the electrodes 13 are first joint points of the wires 30, and the electrodes 21 are second joint points of the wires 30. The outer edge 20e of the semiconductor chip 20 and edge portions of the electrodes 13 on the outer edge 20e side regulate distances D between the semiconductor chip 20 and the electrodes 13.

Hereinafter, a direction intersecting (orthogonal to) the direction from the electrodes 13 toward the electrodes 21 (an extending direction of the wires 30) and a direction along the front surfaces 10s and 20s may be referred to as a first direction, and a direction intersecting (orthogonal to) the front surfaces 10s and 20s may be referred to as a second direction. The first direction is a horizontal direction, as an example, and the second direction is a vertical direction, as an example.

In addition, a constitution such as a recessed portion or a hole portion for reducing a thickness of the mounting substrate 10 (a distance between the front surface 10s and the rear surface 10r) is not provided between regions in which the electrodes 13 are provided on the front surface 10s of the mounting substrate 10 and a region in which the semiconductor chip 20 is provided on the front surface 10s. For this reason, the thickness of the mounting substrate 10 is uniform throughout the regions in which the electrodes 13 are provided on the front surface 10s, the region in which the semiconductor chip 20 is provided on the front surface 10s, and regions therebetween. However, the thickness of the mounting substrate 10 may be larger than those in other regions in regions between the regions in which the electrodes 13 are provided on the front surface 10s and the region in which the semiconductor chip 20 is provided on the front surface 10s.

Here, between the regions in which the electrodes 13 are provided on the front surface 10s and the region in which the semiconductor chip 20 is provided on the front surface 10s, for example, an insulation member 60 such as a resist is formed on the front surface 10s. The insulation member 60 is interposed between the front surface 10s and the wires 30 when viewed in the first direction and is interposed between the semiconductor chip 20 and the electrodes 13 when viewed in the second direction.

The wires 30 extend from the electrodes 13 toward the electrodes 21 and electrically connect the mounting substrate 10 and the semiconductor chip 20 to each other by connecting the electrodes 13 and the electrodes 21 to each other. As described above, the wires 30 are integrated by being respectively joined to the bonding portions 51 on the electrodes 13 and the bonding portions 52 on the electrodes 21. For example, the wires 30 are made of a metal such as gold. Each of the wires 30 includes a first part 31, a first bent portion 41, a second part 32, a second bent portion 42, and a third part 33 arranged in order from the electrode 13 toward the electrode 21.

Here, the first part 31 and the second part 32 are connected to each other with the first bent portion 41 therebetween, and the second part 32 and the third part 33 are connected to each other with the second bent portion 42 therebetween. Namely, here, the wire 30 is constituted of the first part 31, the first bent portion 41, the second part 32, the second bent portion 42, and the third part 33. The wire 30 is joined to the bonding portion 51 (joined to the electrode 13 with the bonding portion 51 therebetween) in the first part 31 and is joined to the bonding portion 52 (joined to the electrode 21 with the bonding portion 52 therebetween) in the third part 33.

The first part 31 is constituted of a base end portion 31a joined to the electrode 13 with the bonding portion 51 therebetween, a tip portion 31c connected to the second part 32, and a bent portion 31b connecting the base end portion 31a and the tip portion 31c to each other. Here, the base end portion 31a extends from the electrode 13 toward a side opposite to the front surface 10s (here, the upper side) and reaches the bent portion 31b. The bent portion 31b is bent such that it protrudes to a side opposite to the front surface 10s. The tip portion 31c obliquely extends such that it approaches the front surface 10s as it is separated from the bent portion 31b, and the tip portion 31c reaches the second part 32. The foregoing first part 31 in its entirety is positioned on the front surface 10s side with respect to the front surface 20s (here, a side lower than the front surface 20s). That is, the first part 31 is retained on the front surface 10s side with respect to the front surface 20s.

The first bent portion 41 is positioned on the front surface 10s side with respect to the front surface 20s when viewed in the first direction, is interposed between the first part 31 and the second part 32, and is connected to the first part 31 and the second part 32. The first bent portion 41 is bent such that it protrudes to the front surface 10s side. Accordingly, the first bent portion 41 converts inclination of the wire 30 when viewed in the first direction from inclination of approaching the front surface 10s toward the electrode 21 at the tip portion 31c of the first part 31 into inclination of separating from the front surface 10s toward the electrode 21 at the second part 32, which will be described below. In other words, the first bent portion 41 is bent such that the second part 32 is guided to the front surface 20s side. The first bent portion 41 is positioned on the electrode 13 side with respect to a center of the wire 30 in the extending direction of the wire 30.

A portion of the second part 32 on the first bent portion 41 side is positioned on the front surface 10s side with respect to the front surface 20s (here, positioned below the front surface 20s) when viewed in the first direction, and the remaining portion thereof on the electrode 21 side protrudes from the front surface 20s to a side opposite to the front surface 10s (here, positioned above the front surface 20s). That is, the second part 32 extends over the front surface 20s from the first bent portion 41 to a side opposite to the front surface 10s. As described above, the wire 30 is inclined such that it is separated from the front surface 10s toward the electrode 21 as the second part 32 is guided to the first bent portion 41.

The second bent portion 42 is positioned at a position protruding from the front surface 20s on a side opposite to the front surface 10s when viewed in the first direction (here, positioned above the front surface 20s), is interposed between the second part 32 and the third part 33, and is connected to the second part 32 and the third part 33. The second bent portion 42 is bent such that it protrudes to a side opposite to the front surfaces 10s and 20s. Accordingly, the second bent portion 42 converts inclination of the wire 30 when viewed in the first direction from inclination of separating from the front surface 10s toward the electrode 21 at the second part 32 into inclination of approaching the front surface 20s toward the electrode 21 at the third part 33, which will be described below. In other words, the second bent portion 42 is bent such that the third part 33 is guided to the front surface 20s side. The second bent portion 42 is positioned on the electrode 21 side with respect to the center of the wire 30 in the extending direction of the wire 30.

The third part 33 protrudes from the front surface 20s to a side opposite to the front surface 10s when viewed in the first direction (here, positioned above the front surface 20s). That is, the third part 33 extends toward the front surface 20s from a position over the front surface 20s on a side opposite to the front surface 10s when viewed in the first direction and is joined to the bonding portion 52 (electrode 21). As described above, the wire 30 is inclined such that it approaches the front surface 20s toward the electrode 21 as the third part 33 is guided to the second bent portion 42.

From the above, the wire 30 in its entirety is bent such that it protrudes to the front surface 10s side in the first bent portion 41 and is bent such that it protrudes to a side opposite to the front surfaces 10s and 20s in the second bent portion 42, thereby extending in an M-shape from the electrode 13 to the electrode 21.

The wire 30 extends obliquely with respect to the outer edge 20e of the semiconductor chip 20 (inclined with respect to a line orthogonal to the outer edge 20e) when viewed in the second direction intersecting the front surfaces 10s and 20s (in FIG. 1(a)). However, the wire 30 may extend parallel to a line orthogonal to the outer edge 20e of the semiconductor chip 20 when viewed in the second direction.

The resin portion M is provided on the front surface 10s over a top surface (front surface 20s) of the semiconductor chip 20. Accordingly, the semiconductor chip 20 and the wire 30 in their entirety are sealed by the resin portion M. For example, a material of the resin portion M is silicone, epoxy, or the like.

Figure 3:
FIG. 3 is a schematic cross-sectional view illustrating a step of a manufacturing method for a semiconductor device for manufacturing the semiconductor device illustrated in FIG. 1.
Figure 3:
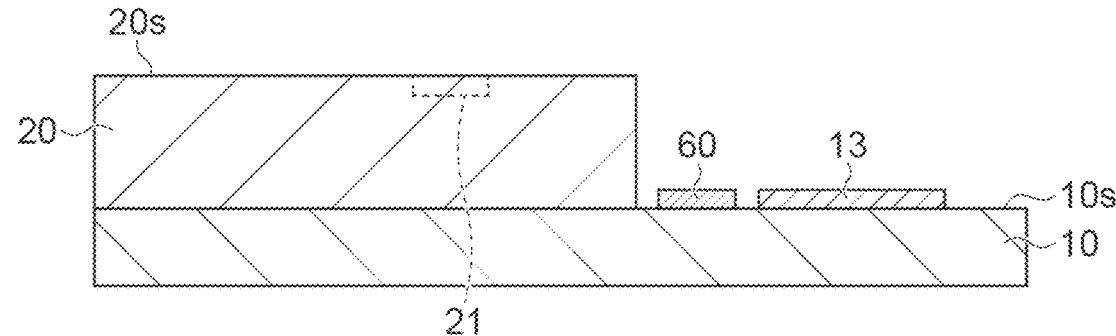
Figure 3:
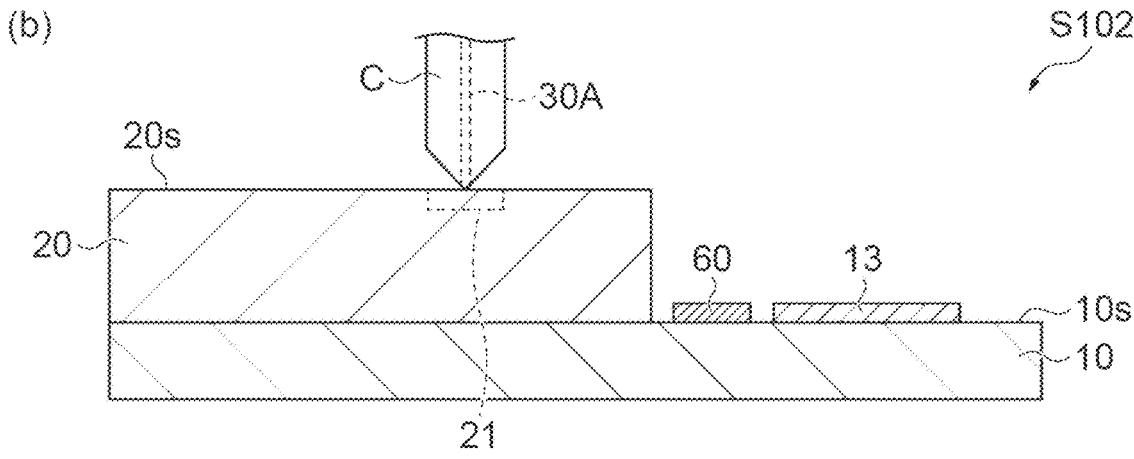
Figure 3:
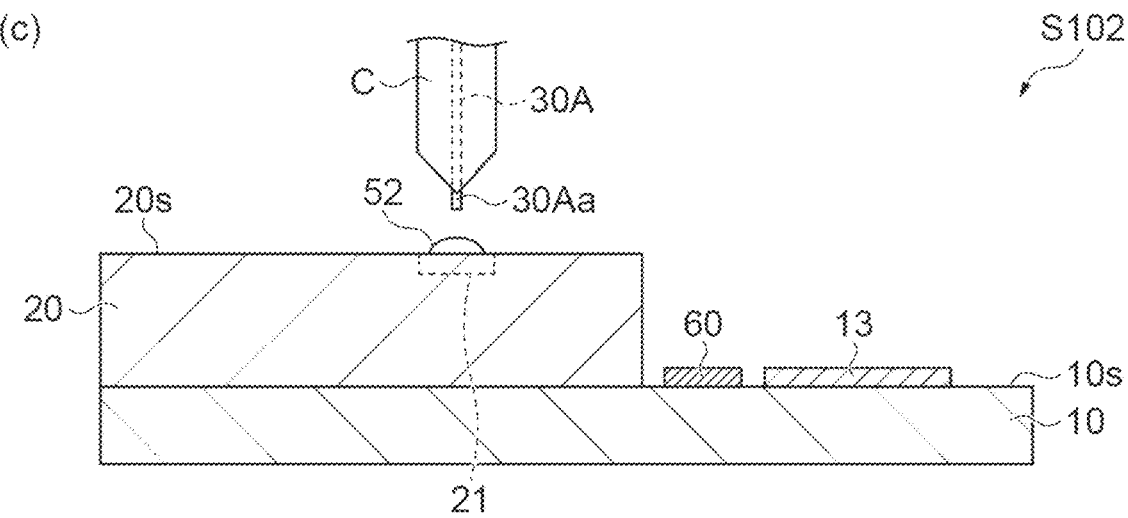
Figure 4:
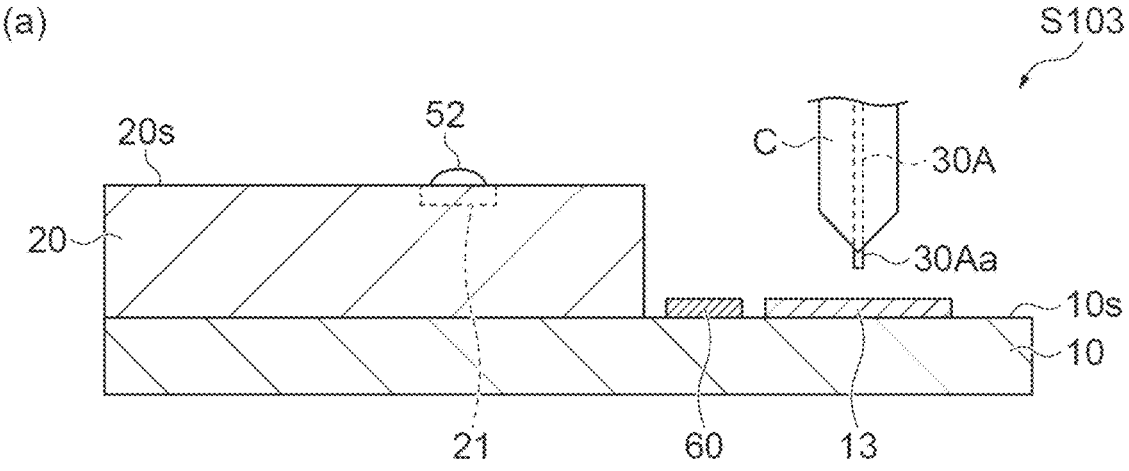
FIG. 4 is a schematic cross-sectional view illustrating another step of the manufacturing method for a semiconductor device for manufacturing the semiconductor device illustrated in FIG. 1.
Figure 4:
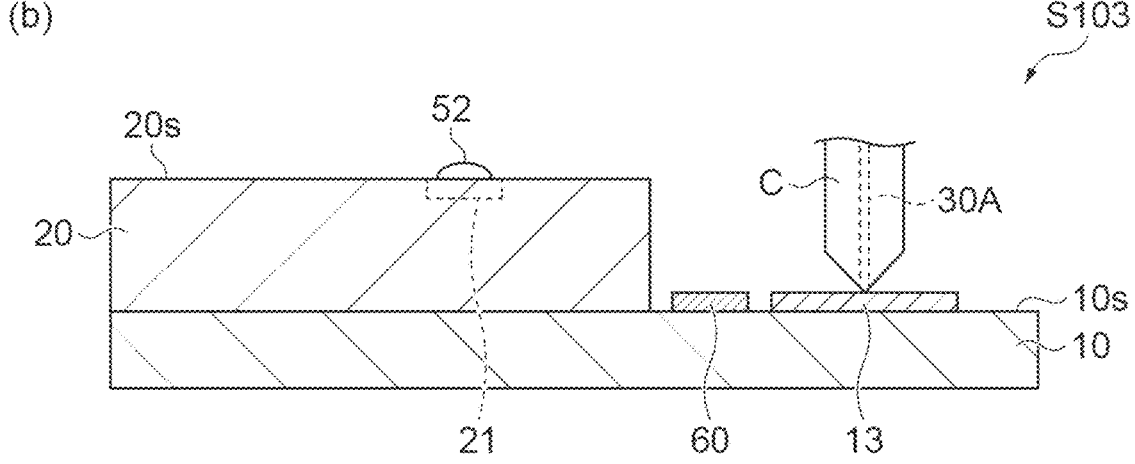
Figure 4:
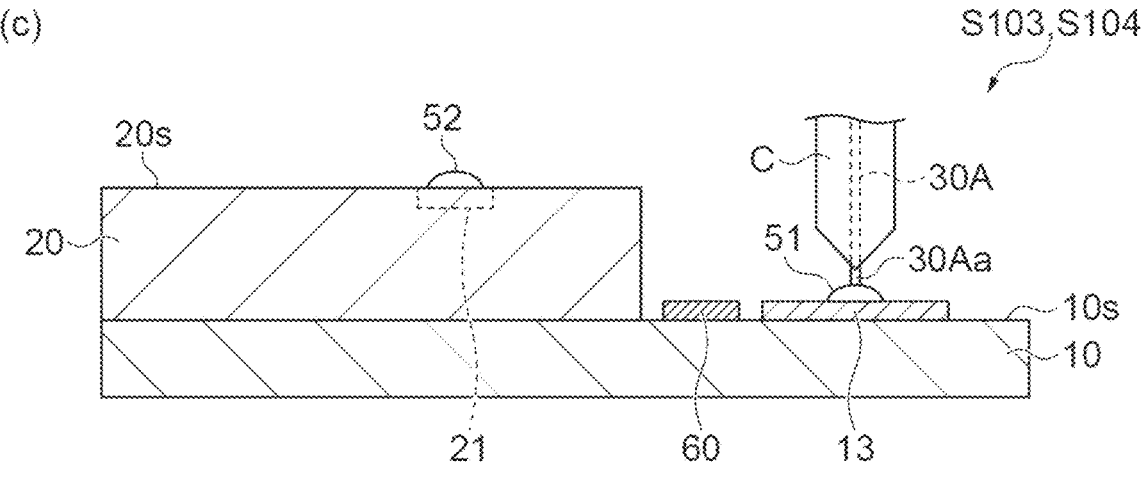
Figure 5:
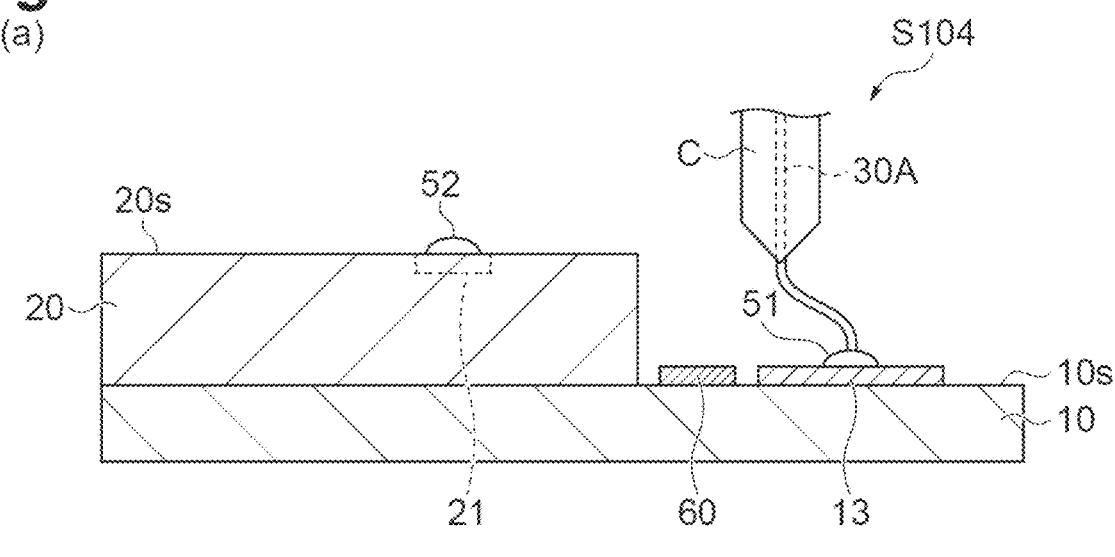
FIG. 5 is a schematic cross-sectional view illustrating another step of the manufacturing method for a semiconductor device for manufacturing the semiconductor device illustrated in FIG. 1.
Figure 5:
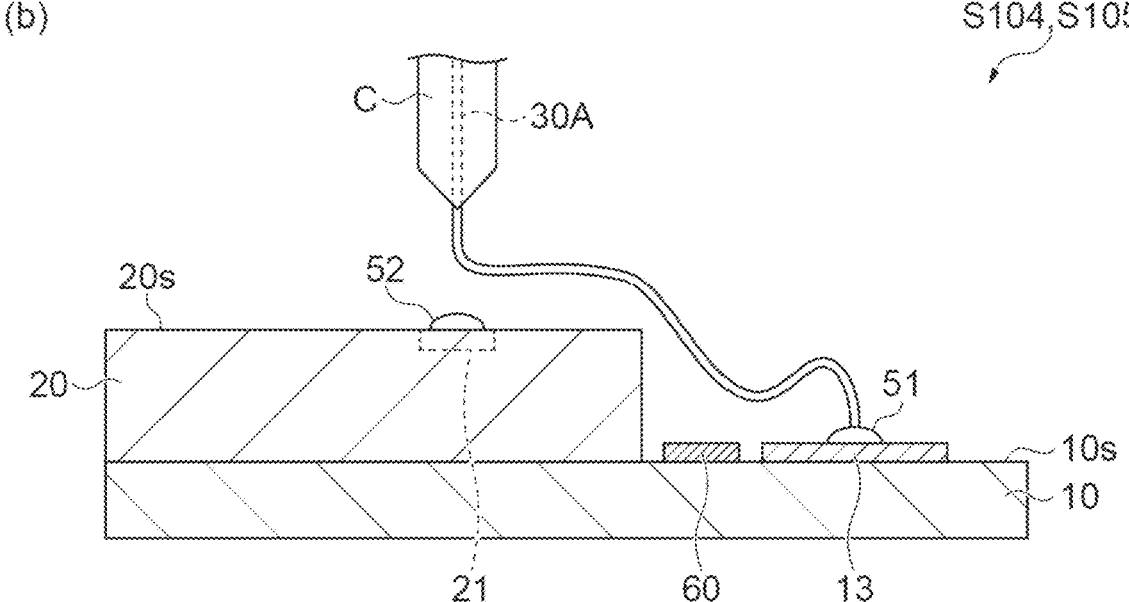
Figure 5:
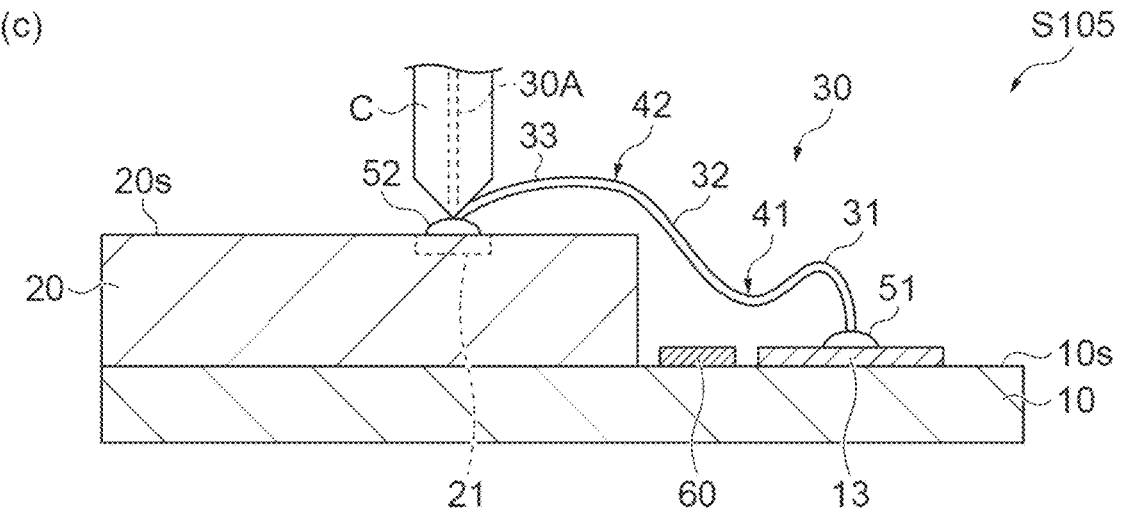

Subsequently, a manufacturing method for the foregoing semiconductor device 1 will be described. FIGS. 3 to 5 are schematic cross-sectional views illustrating steps of the manufacturing method for a semiconductor device for manufacturing the semiconductor device illustrated in FIG. 1. In this manufacturing method, as illustrated in FIG. 3(a), first, the mounting substrate 10, the semiconductor chip 20 mounted on the front surface 10s of the mounting substrate 10, and at least base materials 30A for the wires 30 are prepared (Step S101, a first step). For example, each of the base materials 30A is formed to have a wire shape using a metal such as gold. The base material 30A is held by (inserted through) a capillary C included in a device for wire bonding.

Subsequently, as illustrated in FIGS. 3(a) to 3(c), the capillary C is moved to the electrode 21 that is the second joint point, and the bonding portion 52 is formed in the electrode 21 by joining a tip 30Aa of the base material 30A caused to protrude from the capillary C to the electrode 21 and cutting the tip 30Aa thereafter (Step S102, a fifth step). More specifically, in this Step S102, first, a wire ball is formed by melting the tip 30Aa of the base material 30A caused to protrude from the capillary C. Subsequently, the wire ball is pressed against the electrode 21 while heat or ultrasonic waves are applied thereto. Accordingly, the bonding portion 52 is formed from the wire ball. Thereafter, the bonding portion 52 is cut off from the base material 30A.

In the succeeding step, as illustrated in FIGS. 4(a) and 4(b), the capillary C holding the base material 30A is moved to a position on the electrode 13, and a new tip 30Aa of the base material 30A caused to protrude from the capillary C is joined to the electrode 13 that is the first joint point (Step S103, a second step). More specifically, in this Step S103, first, a wire ball is formed by melting the tip 30Aa of the base material 30A caused to protrude from the capillary C. Thereafter, the wire ball is pressed against the electrode 13 while heat or ultrasonic waves are applied thereto. Accordingly, as illustrated in FIG. 4(c), the bonding portion 51 is formed, and ball bonding is performed.

Subsequently, as illustrated in FIGS. 4(c), 5(a) to 5(c), the capillary C is moved while the base material 30A is drawn from the capillary C and while the base material 30A is caused to have a tendency, and the first part 31, the first bent portion 41, the second part 32, the second bent portion 42, and the third part 33 arranged in order are formed (Step S104, a third step).

Further, as illustrated in FIG. 5(c), the capillary C is moved to a position on the electrode 21, and the base material 30A is joined to the electrode 21, thereby constituting the wire 30 extending from the electrode 13 to the electrode 21 (Step S105, a fourth step). More specifically, here, the base material 30A is pressed against the bonding portion 52 at an edge part of the tip portion of the capillary C, and the base material 30A is joined to the bonding portion 52 by applying heat or ultrasonic waves thereto. Thereafter, the base material 30A is cut (stitched). Accordingly, stitch bonding is performed. Thereafter, the resin portion M is provided, and the semiconductor device 1 is thereby obtained.

As described above, in the semiconductor device, the wires 30 for electrically connecting the mounting substrate 10 and the semiconductor chip 20 mounted on the mounting substrate 10 to each other are provided. The wires 30 connect the electrodes 13 on the front surface 10s of the mounting substrate 10 on which the semiconductor chip 20 is mounted and the electrodes 21 on the front surface 20s of the semiconductor chip 20 to each other. Each of the wires 30 includes the first part 31, the first bent portion 41, the second part 32, the second bent portion 42, and the third part 33 arranged in order from the electrode 13 toward the electrode 21 (from the mounting substrate 10 toward the semiconductor chip 20).

The first part 31 is a part extending from the electrode 13 (bonding portion 51) in the wire 30 and is positioned on the front surface 10s side with respect to the front surface 20s (for example, below the front surface 20s). In addition, the third part 33 is a part joined to the electrode 21 (bonding portion 52) in the wire 30 and is positioned at a position over the front surface 20s on a side opposite to the front surface 10s (for example, above the front surface 20s). The second part 32 is a part between the first part 31 and the third part 33 and extends over the front surface 20s from a position on the front surface 10s side.

According to such a structure, a resin of the resin portion M is disposed between the wires 30 and the mounting substrate 10. On the contrary, regarding the wires 30, the first bent portion 41 between the first part 31 and the second part 32 is positioned on the front surface 10s side with respect to the front surface 20s and is bent such that the second part 32 is guided to the front surface 20s side. Namely, compared to a case of having no first bent portion 41, the wire 30 (that is, the first part 31) extends to the front surface 10s side until it reaches the first bent portion 41. In the meantime, after it reaches the first bent portion 41, the wire (that is, the second part 32) extends over the front surface 20s. Namely, compared to a case of having no first bent portion 41, the wire 30 extends along edge portions formed by the mounting substrate 10 and the semiconductor chip 20. As a result, an amount of resin held by the wire 30 is reduced. Thus, according to this semiconductor device 1, stress applied to the wire 30 according to a thermal cycle can be reduced, and degradation in reliability can be curbed.

In the semiconductor device 1, the wire 30 is bent at a position over the front surface 20s in the second bent portion 42 between the second part 32 and the third part 33, and the third part 33 is guided to the front surface 20s side. Further, the third part 33 extends from a position over the front surface 20s toward the front surface 20s and is joined to the electrode 21 (bonding portion 52). For this reason, compared to a case in which the second bent portion 42 and the third part 33 are not provided and the second part 32 extends from the front surface 10s side and is directly joined to the electrode 21 (bonding portion 52), a situation in which the wire 30 comes into contact with an edge portion of the semiconductor chip 20 is avoided. Thus, degradation in reliability can be further curbed.

In addition, in the semiconductor device 1, the first bent portion 41 is positioned on the electrode 13 side with respect to the center of the wire 30 in the extending direction. For this reason, the first bent portion 41 is formed at a position comparatively away from the semiconductor chip 20. As a result, for example, when the first bent portion 41 is formed as illustrated in FIG. 5(a), a situation in which a holding tool (for example, the foregoing capillary C) for holding the wire 30 comes into contact with the semiconductor chip 20 is curbed.

Moreover, in the semiconductor device 1, the wire 30 extends obliquely with respect to the outer edge 20e of the semiconductor chip 20 when viewed in the second direction intersecting the front surfaces 10s and 20s. For this reason, compared to a case in which the wire 30 is perpendicular to the outer edge 20e of the semiconductor chip 20, it is easy to secure a long length of the wire 30. As a result, it is easy to realize the foregoing structure of the wire 30 including a plurality of parts and a plurality of bent portions.

In the semiconductor device 1, between the regions in which the electrodes 13 are provided on the front surface 10s and the region in which the semiconductor chip 20 is provided on the front surface 10s, the insulation member 60 such as a resist is formed on the front surface 10s. For example, the insulation member 60 may be used for the purpose of forming a pattern of the mounting substrate 10 or insulation between wirings on the front surface 10s. However, it also contributes to reduction of the amount of resin held by the wire 30 by being interposed between the front surface 10s and the wires 30. Thus, in the semiconductor device 1, degradation in reliability is more reliably curbed.

In addition, according to the manufacturing method for a semiconductor device of the present embodiment, the semiconductor device 1 described above is manufactured. That is, a semiconductor device capable of curbing degradation in reliability is obtained. Particularly, the manufacturing method for a semiconductor device according to the present embodiment includes Step S102 of moving the capillary C to the electrode 21 and forming the bonding portion 52 in the electrode 21 by joining the tip 30Aa of the base material 30A caused to protrude from the capillary C to the electrode 21 and cutting the tip 30Aa thereafter, after Step S101 and before Step S103. At this time, in Step S105, the base material 30A is joined to the electrode 21 with the bonding portion 52 therebetween. As a result, when the tip of the base material 30A protruding from the capillary C is joined to the electrode 21 after each of the portions of the wire 30 is formed, the bonding portion 52 which has already been formed in the electrode 21 is interposed therebetween, and thus an impact to the semiconductor chip 20 side is reduced. Particularly, here, since the bonding portion 52 is formed using the capillary C and the base material 30A for forming each of the portions of the wire 30, simplification the steps is achieved.

The foregoing embodiment has described an aspect of the present disclosure. Therefore, the present disclosure is not limited to the foregoing embodiment and may be arbitrarily deformed. As an example, the semiconductor device 1 according to the foregoing embodiment may be deformed in accordance with the distance D between the semiconductor chip 20 and the electrode 13 or the height T of the semiconductor chip 20. Subsequently, modification examples of the semiconductor device 1 according to the foregoing embodiment will be described.

First Modification Example

Figure 6:
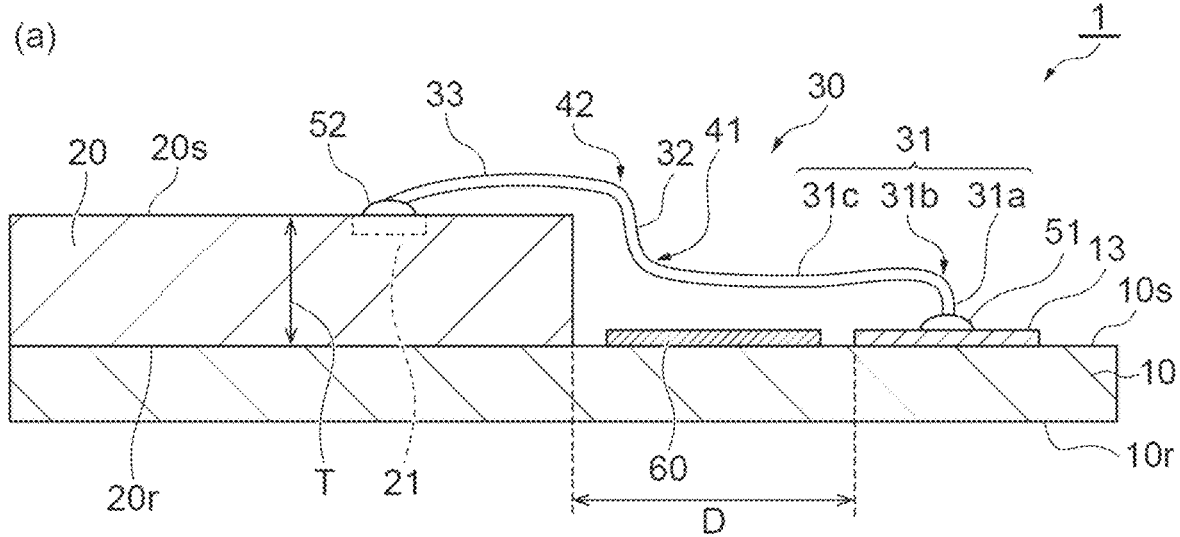
FIG. 6 is a view illustrating the semiconductor device according to a first modification example.
Figure 6:
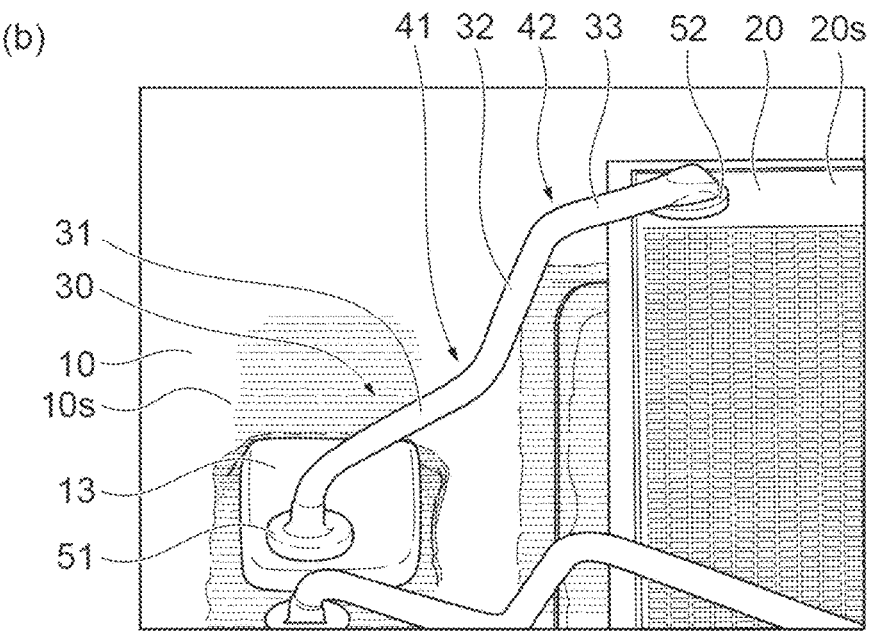

FIG. 6 is a view illustrating the semiconductor device according to a first modification example. FIG. 6(a) is a schematic cross-sectional view, and FIG. 6(b) is an enlarged photograph. In the example illustrated in FIG. 6, compared to FIG. 1, the distance D between the electrode 13 and the semiconductor chip 20 is increased. In such a case, the length of the first part 31 extending to the front surface 10s side with respect to the front surface 20s can be relatively increased by positioning the first bent portion 41 on the semiconductor chip 20 side. Accordingly, the first bent portion 41 is positioned on the electrode 21 side with respect to the center of the wire 30 in the extending direction. Here, from among the first part 31, since the tip portion 31c which is positioned on the second part 32 side with respect to the bent portion 31b is extended, the first bent portion 41 is positioned on the electrode 21 side.

According to the foregoing first modification example, the first bent portion 41 is formed at a position comparatively closer to the semiconductor chip 20. As a result, a relatively long part of the wire 30 extending to the front surface 10s side (first part 31) is secured so that the amount of resin held by the wire 30 is further reduced. That is, stress applied to the wire 30 can be reliably reduced, and degradation in reliability can be reliably curbed.

Second Modification Example

Figure 7:
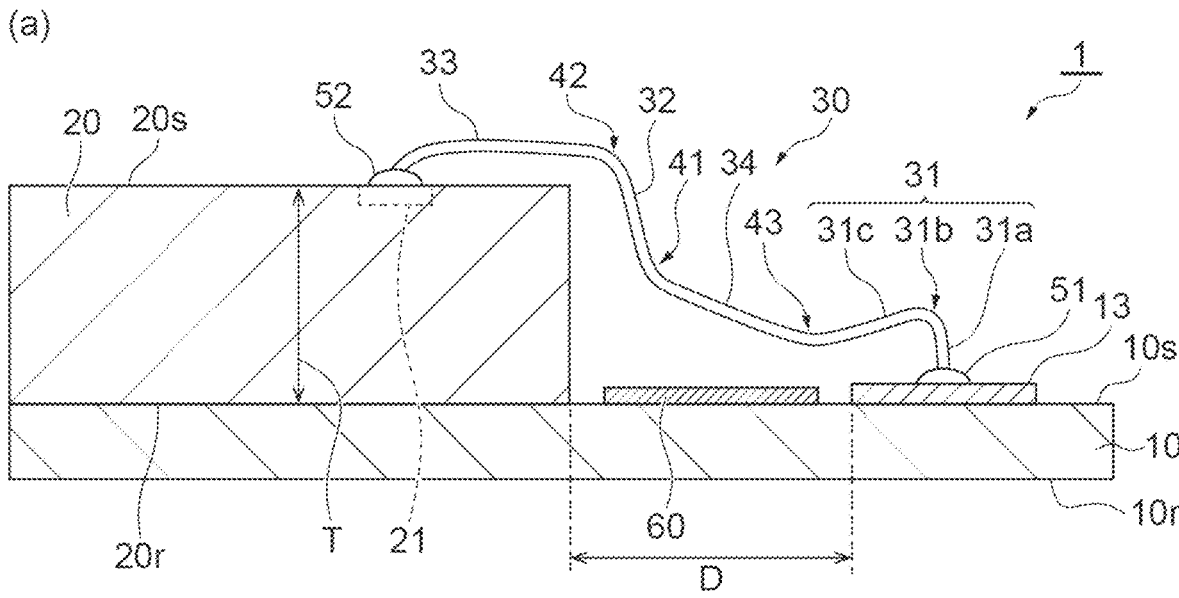
FIG. 7 is a view illustrating the semiconductor device according to a second modification example.
Figure 7:
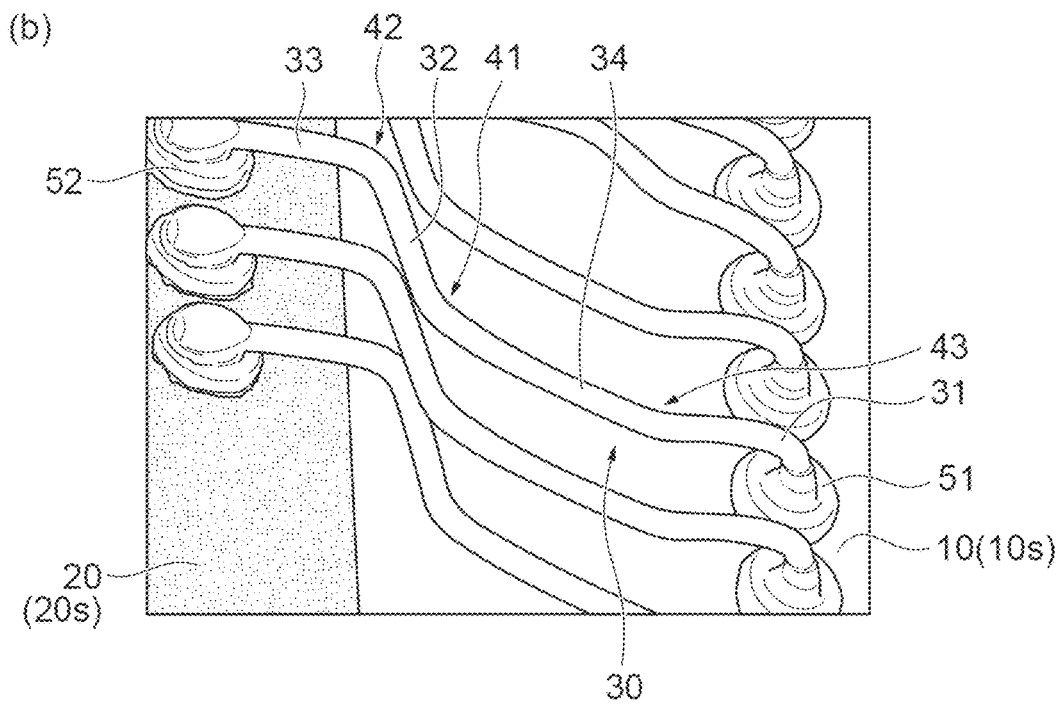

FIG. 7 is a view illustrating the semiconductor device according to a second modification example. FIG. 7(a) is a schematic cross-sectional view, and FIG. 7(b) is an enlarged photograph. In the example of FIG. 7, compared to FIG. 1, the height T of the semiconductor chip 20 is increased. Here, a third bent portion 43 and a fourth part 34 are interposed between the first part 31 and the first bent portion 41. The third bent portion 43 and the fourth part 34 are arranged in this order in a direction from the electrode 13 toward the electrode 21.

The third bent portion 43 and the fourth part 34 are positioned on the front surface 10s side with respect to the front surface 20s. The third bent portion 43 is connected to the first part 31 and the fourth part 34. The third bent portion 43 is bent such that it protrudes to the front surface 10s side. That is, the third bent portion 43 is bent such that it protrudes in the same direction as the first bent portion 41. Accordingly, the third bent portion 43 converts inclination of the wire 30 when viewed in the first direction from inclination of approaching the front surface 10s toward the electrode 21 at the tip portion 31c of the first part 31 into inclination of separating from the front surface 10s toward the electrode 21 at the fourth part 34, which will be described below. In other words, the third bent portion 43 is bent such that the fourth part 34 is guided to the front surface 20s side.

The fourth part 34 obliquely extends such that it is separated from the front surface 10s toward the electrode 21 so as to connect the first part 31 and the first bent portion 41 to each other. Here, since the first bent portion 41 is positioned on the electrode 21 side by the amount of length of the fourth part 34, the first bent portion 41 is positioned on the electrode 21 side with respect to the center of the wire 30 in the extending direction. However, the first bent portion 41 may be positioned at the center of the wire 30 in the extending direction or on the electrode 13 side with respect to the center in accordance with the length of the fourth part 34.

In this example, the inclination direction of the wire 30 does not change on front and rear sides of the first bent portion 41 (that is, the fourth part 34 and the second part 32). That is, here, the first bent portion 41 is bent such that it protrudes to the front surface 10s side so as to maintain the inclination of separating from the front surface 10s toward the electrode 21 in the fourth part 34 in the second part 32 as well.

According to the foregoing second modification example, since the height T of the semiconductor chip 20 from the front surface 10s can be secured by at least two parts such as the second part 32 and the fourth part 34, sharp bending in which concentration of stress is likely to occur is no longer necessary. Thus, degradation in reliability can be more reliably curbed.

Third Modification Example

Figure 8:
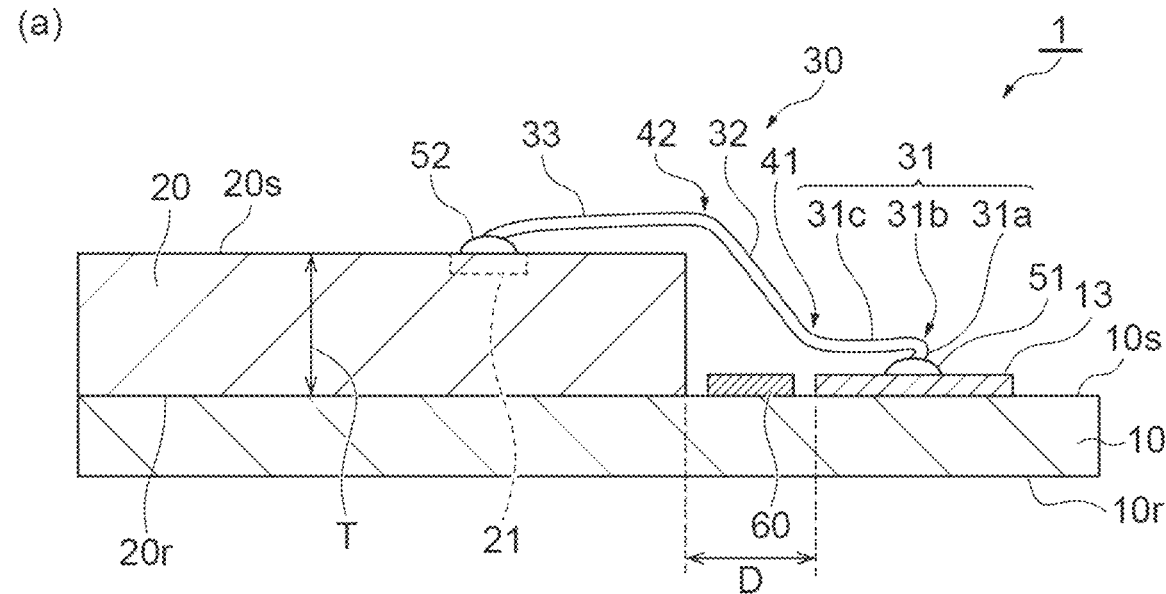
FIG. 8 is a view illustrating the semiconductor device according to a third modification example.
Figure 8:
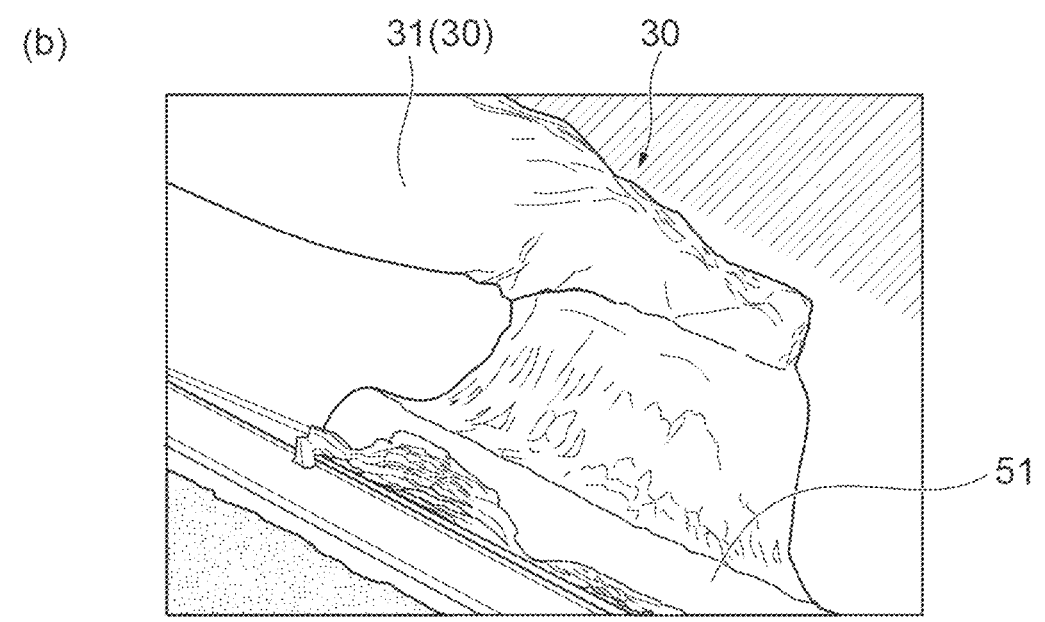

FIG. 8 is a view illustrating the semiconductor device according to a third modification example. FIG. 8(a) is a schematic cross-sectional view, and FIG. 8(b) is an enlarged photograph. In the example illustrated in FIG. 8, an angle of bending of the bent portion 31b of the first part 31 is increased compared to the example in FIG. 1. More specifically, the bent portion 31b is bent at a right angle such that the base end portion 31a extending perpendicular to the front surface 10s and the tip portion 31c extending parallel to the front surface 10s are connected to each other.

According to such a third modification example, the first part 31 extends from the electrode 13 along the front surface 10s so that the amount of resin held by the wire 30 can be further reduced. That is, stress applied to the wire 30 can be reliably reduced, and degradation in reliability can be reliably curbed.

In the foregoing semiconductor device 1, an example in which the bonding portion 52 is provided on the front surface 20s of the semiconductor chip 20 and the wire 30 is joined to this bonding portion 52 has been described. For example, such a bonding portion 52 can be installed using the same material as the wire 30 prior to arrangement of the wire 30 as described above. However, in the semiconductor device 1, the bonding portion 52 is not essential, and the wire 30 may be directly joined to the semiconductor chip 20. In addition, even when the bonding portion 52 is provided, the bonding portion 52 may be separately provided by a device different from the wire bonding device for the wire 30.

Moreover, in the semiconductor device 1, the positions of the bonding portions 51 and 52 may be arbitrarily set. Therefore, inclination of the wire 30 with respect to the outer edge 20e of the semiconductor chip 20 may also be arbitrarily set in accordance with the positional relationship between the bonding portions 51 and 52 (electrodes 13 and 21) when viewed in the second direction.

INDUSTRIAL APPLICABILITY

A semiconductor device and a manufacturing method for a semiconductor device capable of curbing degradation in reliability are provided.

REFERENCE SIGNS LIST

1 Semiconductor device
10 Mounting substrate
10s Front surface (first surface)
13 Electrode (first joint point)
20 Semiconductor chip
20s Front surface (second surface)
21 Electrode (second joint point)
30 Wire
31 First part
32 Second part
33 Third part
34 Fourth part
41 First bent portion
42 Second bent portion
51 Bonding portion
52 Bonding portion

The invention claimed is:
1. A semiconductor device comprising:
a mounting substrate having a first surface;
a semiconductor chip mounted on the first surface and having a second surface facing a side opposite to the first surface; and
a wire extending from a first joint point on the first surface toward a second joint point on the second surface and electrically connecting the mounting substrate and the semiconductor chip to each other by connecting the first joint point and the second joint point to each other, wherein the wire includes a first part, a first bent portion, a second part, a second bent portion, and a third part arranged in order from the first joint point toward the second joint point, wherein the first part is positioned on a first surface side with respect to the second surface when viewed in a first side direction along the first surface and the second surface, wherein the first bent portion is positioned on the first surface side with respect to the second surface when viewed in the first side direction and is bent such that the second part is guided to a second surface side, wherein the second part extends over the second surface on a side opposite to the first surface when viewed in the first side direction, wherein the second bent portion is bent such that the third part is guided to the second surface side, wherein the third part extends from a position over the second surface on a side opposite to the first surface toward the second surface when viewed in the first side direction and is joined to the second joint point, wherein a first end of the wire is joined to the first joint point with a first bonding portion between the first end of the wire and the first joint point, and a second end of the wire is joined to the second joint point with a second bonding portion between the second end of the wire and the second joint point, wherein, when viewed in a second side direction along the first surface and the second surface and intersecting a direction in which the semiconductor chip and the first joint point are aligned, the second bonding portion is provided at a position farther from a center of the semiconductor chip than the first bonding portion, and wherein the wire extends obliquely with respect to an outer edge of the semiconductor chip when viewed in a top view direction intersecting the second surface.

2. The semiconductor device according to claim 1, wherein the first bent portion is positioned on a first joint point side with respect to a center of the wire in an extending direction.

3. The semiconductor device according to claim 1, wherein the first bent portion is positioned on a second joint point side with respect to a center of the wire in an extending direction.

4. The semiconductor device according to claim 1, wherein the wire includes a fourth part extending such that the first part and the first bent portion are connected to each other.

5. A manufacturing method for a semiconductor device for manufacturing the semiconductor device according to claim 1, the manufacturing method comprising:

a first step of preparing the mounting substrate, the semiconductor chip mounted on the first surface of the mounting substrate, and at least a base material for the wire;

a second step of moving a capillary holding the base material to the first joint point and joining a tip of the base material caused to protrude from the capillary to the first joint point, after the first step;

a third step of moving the capillary while the base material is drawn from the capillary and forming at least the first part, the first bent portion, the second part, the second bent portion, and the third part arranged in order, after the second step; and a fourth step of moving the capillary to the second joint point and constituting the wire extending from the first joint point to the second joint point by joining the base material to the second joint point, after the third step.

6. The manufacturing method for a semiconductor device according to claim 5, further comprising:

a fifth step of moving the capillary to the second joint point and forming the second bonding portion at the second joint point by joining a tip of the base material caused to protrude from the capillary to the second joint point and cutting the tip thereafter, after the first step and before the second step, wherein in the fourth step, the base material is joined to the second joint point with the second bonding portion therebetween.

* * * * *